(12) United States Patent
Lin

(10) Patent No.: US 7,532,038 B2
(45) Date of Patent: May 12, 2009

(54) PHASE DETECTING CIRCUIT HAVING ADJUSTABLE GAIN CURVE AND METHOD THEREOF

(75) Inventor: Joanna Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 62 days.

(21) Appl. No.: 11/477,918

(22) Filed: Jun. 30, 2006

(65) Prior Publication Data

US 2007/0001713 A1 Jan. 4, 2007

Related U.S. Application Data

(60) Provisional application No. 60/695,430, filed on Jul. 1, 2005.

(51) Int. Cl.
*G01R 25/00* (2006.01)
*H03D 13/00* (2006.01)

(52) U.S. Cl. .............................. 327/12; 327/3; 327/147; 327/156

(58) Field of Classification Search ............ 327/2, 327/3, 5, 7, 8, 12, 141, 144, 145–148, 150, 327/155–157, 159, 162, 163; 375/371–376
See application file for complete search history.

(56) References Cited

U.S. PATENT DOCUMENTS

| 6,026,134 | A | * | 2/2000 | Duffy et al. | 375/376 |
| 6,249,159 | B1 | * | 6/2001 | Johnson | 327/157 |
| 6,259,278 | B1 | * | 7/2001 | Huang | 327/12 |
| 6,442,225 | B1 | * | 8/2002 | Huang | 375/376 |
| 6,456,128 | B1 | * | 9/2002 | Nakamura | 327/149 |
| 7,078,938 | B2 | * | 7/2006 | Kim | 327/2 |
| 7,330,058 | B2 | * | 2/2008 | Lin | 327/157 |

* cited by examiner

*Primary Examiner*—Donovan Lincoln
*Assistant Examiner*—Patrick O'Neill
(74) *Attorney, Agent, or Firm*—Birch, Stewart, Kolasch & Birch, LLP

(57) ABSTRACT

A phase detecting circuit having an adjustable gain curve includes a plurality of phase detectors and a logic circuit. The phase detectors detect phase differences between a data signal and a plurality of clock signals by comparison to output a plurality of control signals. The clock signals have the same frequency but different phases, and the frequency of the data signal is a multiple of the frequency of the clock signals. The logic circuit performs various logic operations according to these control signals to output at least one set of gain control signals for adjusting a gain curve of the phase detecting circuit.

7 Claims, 13 Drawing Sheets

PHASE DETECTING CIRCUIT HAVING ADJUSTABLE GAIN CURVE AND METHOD THEREOF

This application claims the benefit of U.S. Provisional Application Ser. No. 60/695,430, entitled "Binary Phase Detector", filed Jul. 1, 2005.

BACKGROUND OF THE INVENTION

1. Field of Invention

The invention relates to a phase detecting circuit and a phase detecting method applied to a clock and data recovery circuit, and, in particular, to a phase detecting circuit, which has an adjustable gain curve and operates at a low frequency, and a method thereof.

2. Related Art

In the modern communication system, the way of high-speed sequential signal transmission has gradually replaced the previous parallel signal transmission. During the high-speed sequential signal transmission, the original low-speed parallel signal has to be converted into a high-speed sequential signal first to facilitate the transmission. Thus, a clock generating circuit for generating a high-speed clock signal for sampling the high-speed sequential signal is needed. At the receiving end, a clock and data recovery circuit for recovering the sampled high-speed sequential signal is needed. The clock and data recovery circuit typically has the architecture of a phase-locked loop circuit, which compares the sampled high-speed sequential signal (hereinafter referred to as the data signal) with a clock signal to generate a phase difference. Thus, the self-calibrations of the clock signal and the data signal can be achieved, and the error rate of recovering the data signal may be reduced.

Referring to FIG. 1, a conventional clock and data recovery circuit 1 includes a phase detecting circuit 11, a charge pump 12, a filter 13 and a voltage control oscillator 14. The voltage control oscillator 14 generates a clock signal CLK. The phase detecting circuit 11 detects a phase difference between a data signal DATA and the clock signal CLK to generate two control signals UP, DN. Herein, the control signals UP, DN control one set of switches 121 of the charge pump 12 to turn on one set of current sources 122 such that a current I inputted to or outputted from the set of current sources 122 charges/discharges the filter 13 to make the filter 13 generate an output voltage V. The voltage V can control the voltage control oscillator 14 to adjust the phase of the clock signal CLK such that the phase difference between the clock signal CLK and the data signal DATA may be kept constant.

The conventional phase detecting circuit 11 may be a linear phase detector or a bang-bang phase detector. However, when the phase detecting circuit 11 is the linear phase detector, the control signals UP, DN generated by the phase detecting circuit 11 operating at the ultra-high frequency cannot smoothly trigger the charge pump 12 to operate. So, the bang-bang phase detector is often used in the high-speed clock and data recovery circuit 1.

FIG. 2 is a circuit diagram showing the conventional bang-bang phase detector, which includes four D flip-flops 111-114 and two XOR gates 115, 116. The D flip-flop 111 is triggered at a rising edge of the clock signal CLK to sample the data signal DATA and output a signal $Q_1$. The D flip-flop 113 is triggered at a falling edge of the clock signal CLK to sample the data signal DATA and output a signal $Q_3$. Next, the D flip-flop 112 is triggered at the rising edge of the clock signal CLK to sample the signal $Q_1$ and output a signal $Q_2$. The D flip-flop 114 is triggered at the rising edge of the clock signal CLK to sample the signal $Q_3$ and output a signal $Q_4$. The XOR gate 115 processes the signals $Q_2$, $Q_4$ by the XOR operation to output a control signal UP. The XOR gate 116 processes the signals $Q_1$, $Q_4$ by the XOR operation to output a control signal DN. FIGS. 3 and 4 show signal timings when the bang-bang phase detector of FIG. 2 is operating. As shown in FIG. 3, when the control signal UP is enabled to be 1, the control signal UP controls the charge pump 12 to speed up the clock signal CLK generated by the voltage control oscillator 14. As shown in FIG. 4, when the control signal DN is enabled to be 1, the control signal DN controls the charge pump 12 to slow down the clock signal CLK generated by the voltage control oscillator 14.

FIG. 5 shows a gain curve of the above-mentioned phase detecting circuit 11. When the control signal UP is enabled to be 1, the charge pump 12 generates the current I according to the control signal UP. On the contrary, when the control signal DN is enabled to be 1, the charge pump 12 generates a current −I according to the control signal DN, and the curve is the fixed gain curve. Because the phase detecting circuit 11 utilizes the bang-bang phase detector, which is a nonlinear element, it is very difficult to analyze the gain curve in a linear way. Thus, when the clock and data recovery circuit 1 is applied to various systems, it is impossible to change the gain curve to increase the input jitter tolerance of the clock and data recovery circuit 1 with respect to the data signal DATA. The prior art adds extra circuits including a counter or an accumulator after the phase detecting circuit 11 in the clock and data recovery circuit 1 so as to compensate or correct the control signals UP, DN to increase the input jitter tolerance of the clock and data recovery circuit 1 with respect to the data signal DATA. However, these additional circuits also cause the signal delay between the phase detecting circuit 11 and the voltage control oscillator 14 and generate a larger jitter in the clock and data recovery circuit 1.

In addition, when the frequency of the data signal DATA is getting higher and higher, the phase detecting circuit 11 and the clock and data recovery circuit 1 also have to operate at the high-frequency to thus generate more noises, which deteriorate the circuit efficiency. In addition, the cost of the high-frequency circuit is higher, and the costs of the phase detecting circuit 11 and the clock and data recovery circuit 1 also cannot be reduced.

SUMMARY OF THE INVENTION

The invention provides a phase detecting circuit including a plurality of phase detectors and a logic circuit. The phase detectors detect phase differences between a data signal and a plurality of clock signals by comparison, respectively, to output a plurality of control signals. The clock signals have the same frequency but different phases. A frequency of the data signal is a multiple of the frequency of the clock signals. The logic circuit performs various logic operations according to the control signals to output at least one set of gain control signals for adjusting a gain curve of the phase detecting circuit.

The invention also provides a method of adjusting a gain curve. The method detects phase differences between a data signal and a plurality of clock signals by comparison to generate a plurality of control signals, respectively. The clock signals have the same frequency but different phases, and a frequency of the data signal is a multiple of the frequency of the clock signals. The method further performs various logic operations according to the control signals to adjust the gain curve.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
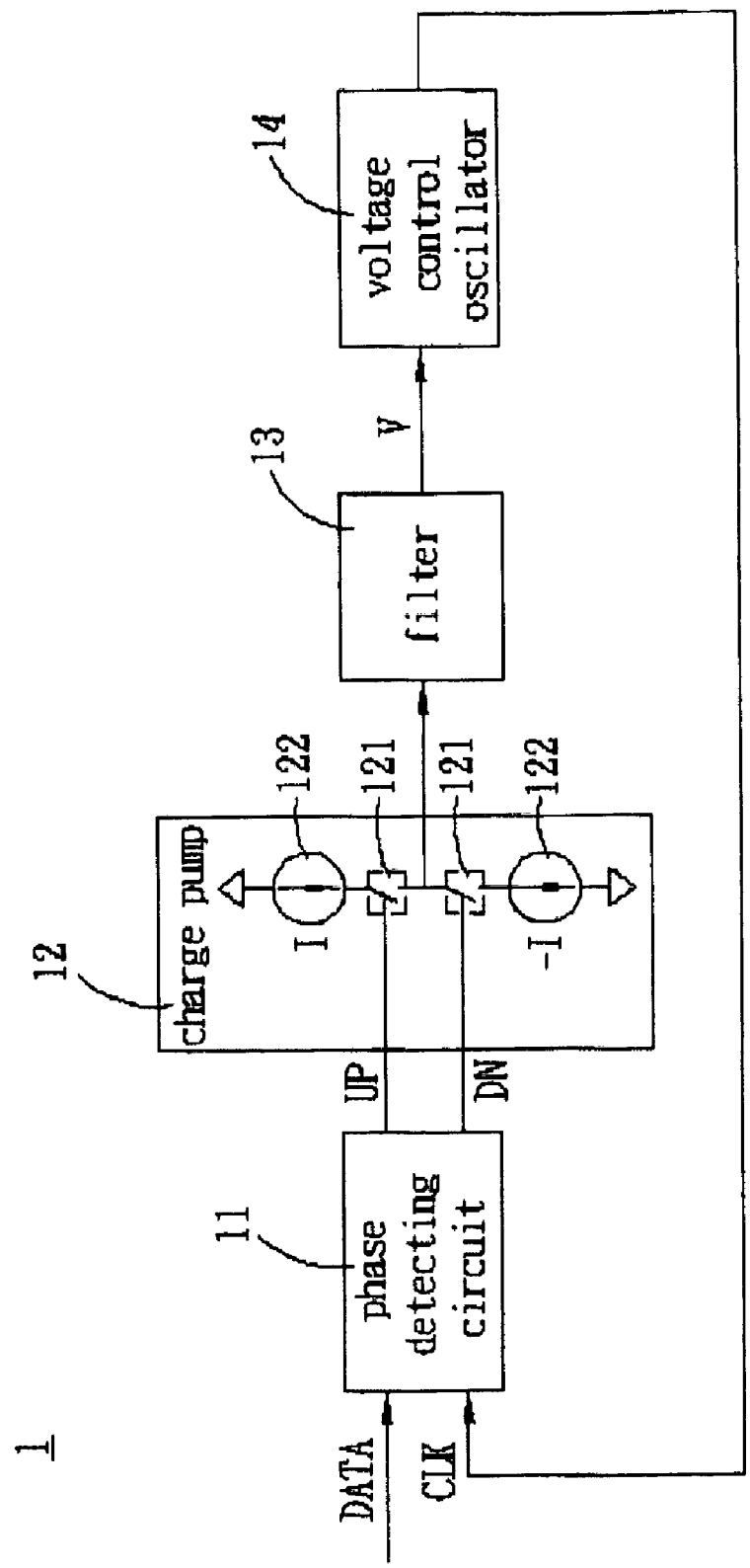
FIG. 1 is a block diagram showing a conventional clock and data recovery circuit.
Figure 2:
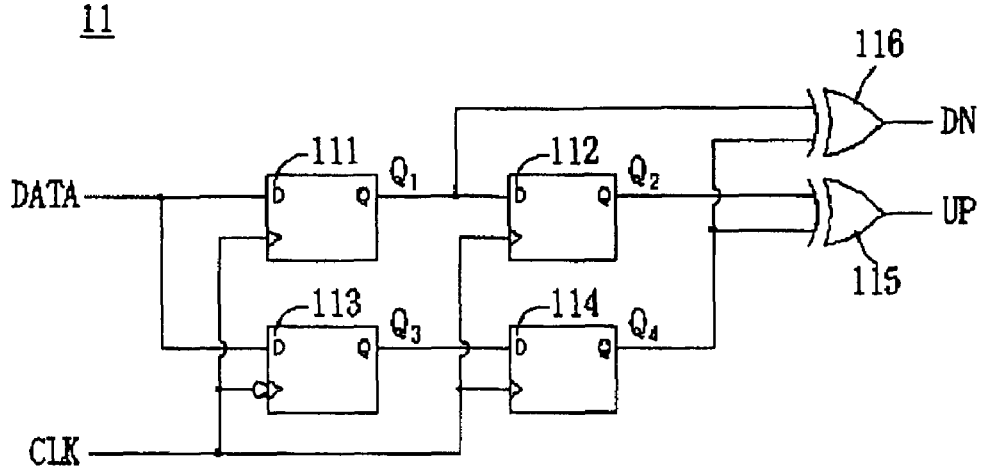
FIG. 2 is a circuit diagram showing a conventional bang-bang phase detector.
Figure 3:
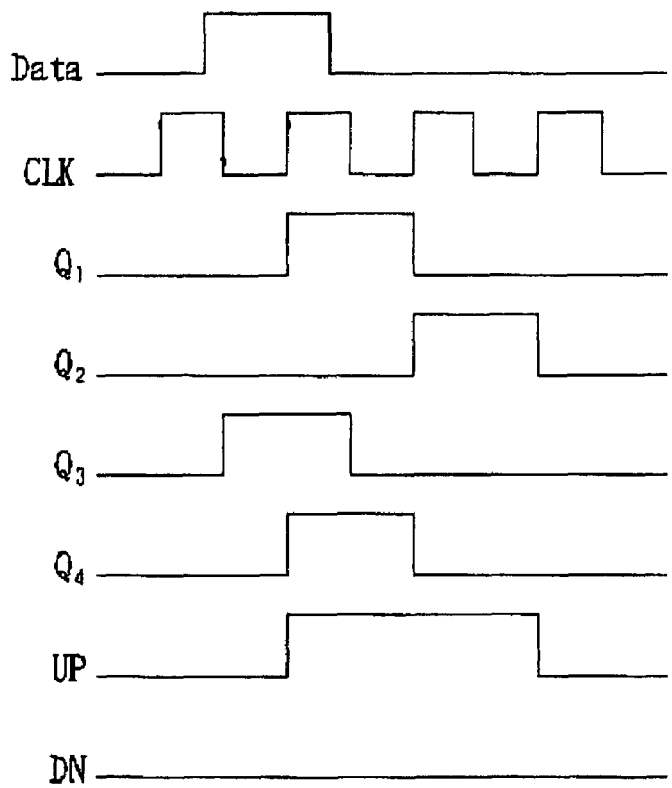
FIGS. 3 and 4 show signal timings when the bang-bang phase detector of FIG. 2 is operating.
Figure 4:
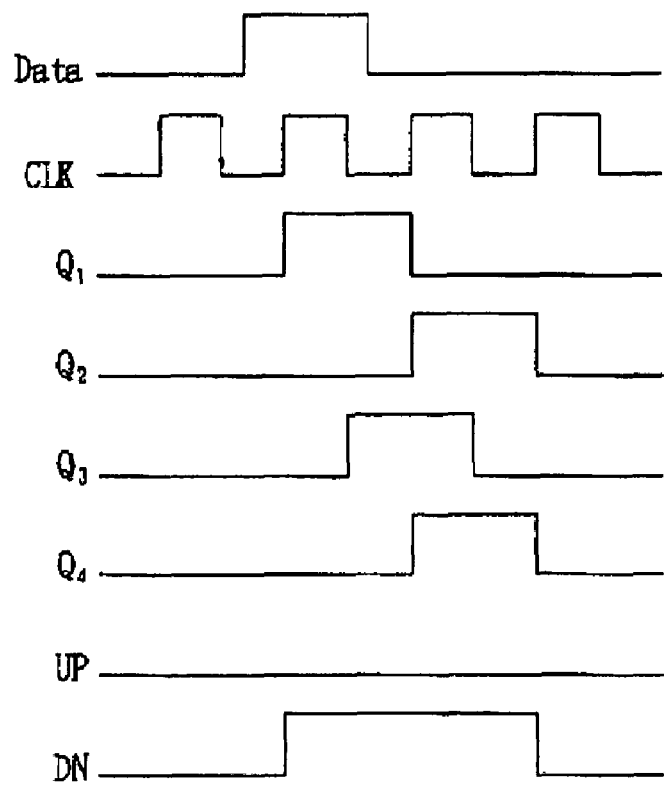
Figure 5:
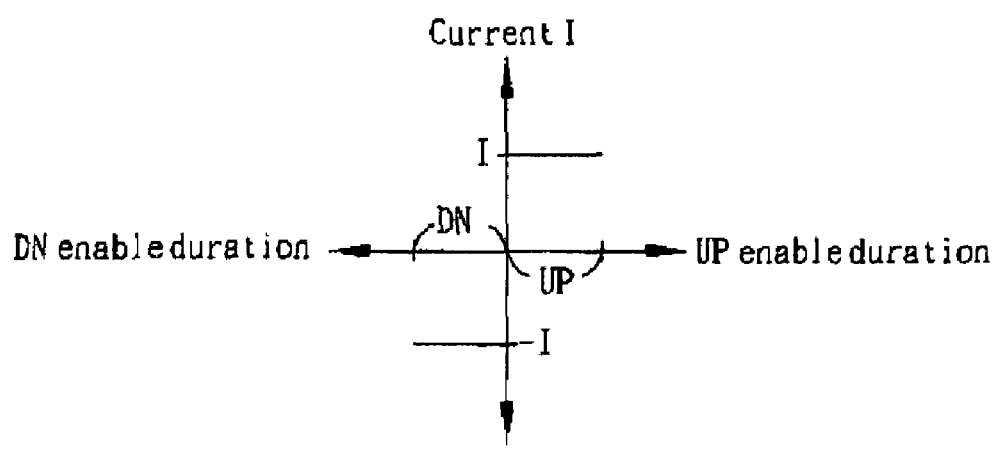
FIG. 5 shows a gain curve of the bang-bang phase detector of FIG. 2.
Figure 6A:
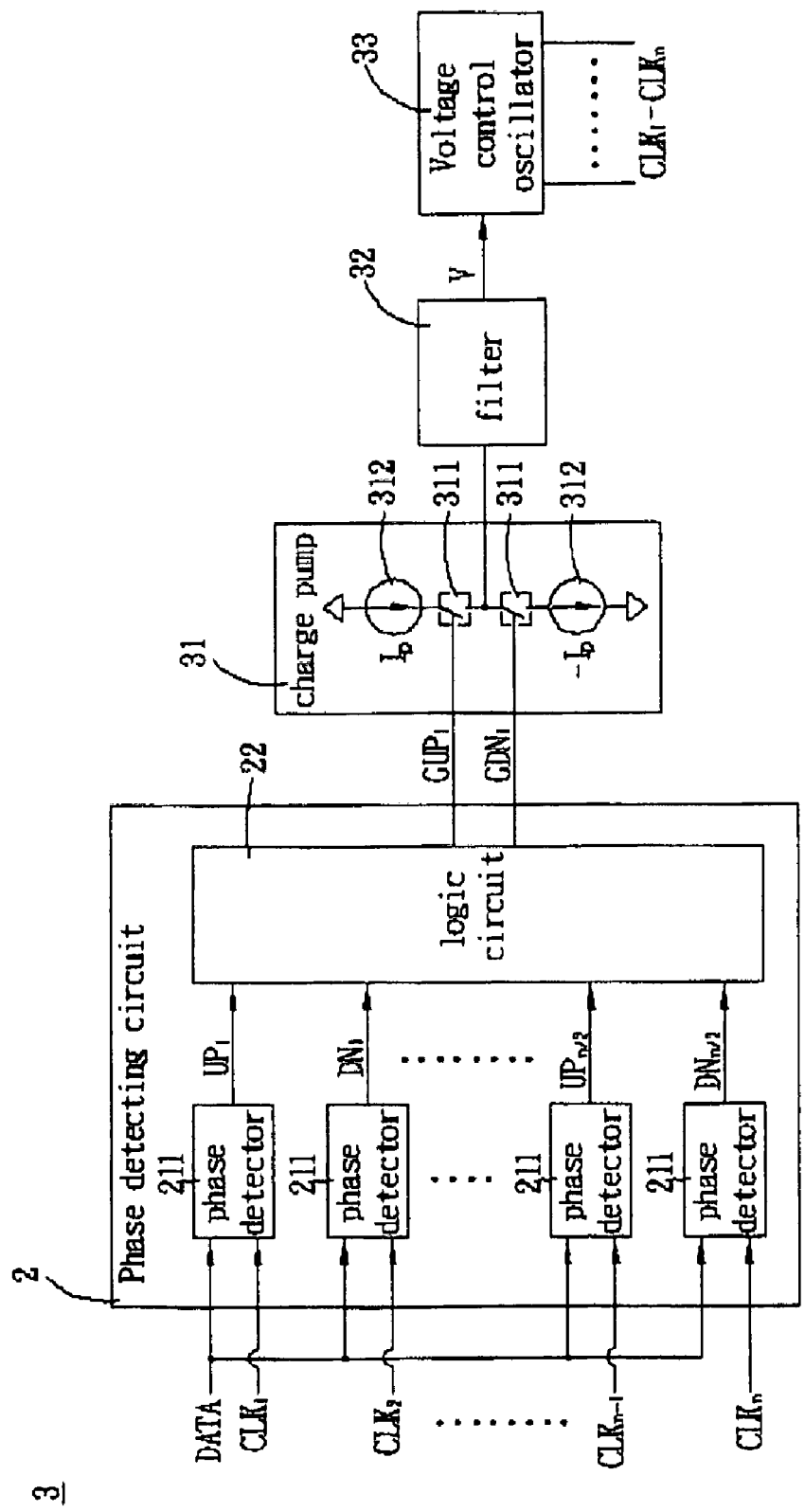
FIG. 6A is a block diagram showing a clock and data recovery circuit according to an embodiment of the invention.

FIG. 6A is a block diagram showing a clock and data recovery circuit 3 according to an embodiment of the invention. Referring to FIG. 6A, the clock and data recovery circuit 3 includes a phase detecting circuit 2, a charge pump 31, a filter 32 and a voltage control oscillator 33. The phase detecting circuit 2 detects a phase difference between a data signal DATA and each of a plurality of clock signals $CLK_1$-$CLK_n$ to generate two gain control signals $GUP_1$, $GDN_1$. The gain control signals $GUP_1$, $GDN_1$ control one set of switches 311 of the charge pump 31 to turn on one set of current sources 312. Thus, a current $I_p$ outputted from or inputted to the set of current sources 312 charges/discharges the filter 32 to generate an output voltage V. The output voltage V controls the voltage control oscillator 33 to adjust the phase and frequency of each of the clock signals $CLK_1$-$CLK_n$ such that the phase difference between each of the clock signals $CLK_1$-$CLK_n$ and the data signal DATA can be held constant. A voltage control oscillating circuit includes n/2 stages of ring oscillators for generating clock signals $CLK_1$-$CLK_n$ with different phases. The clock signals $CLK_1$-$CLK_n$ have the same frequency but different phases, and the frequency of the data signal DATA is a multiple of the frequency of the clock signals $CLK_1$-$CLK_n$.

Figure 6B:
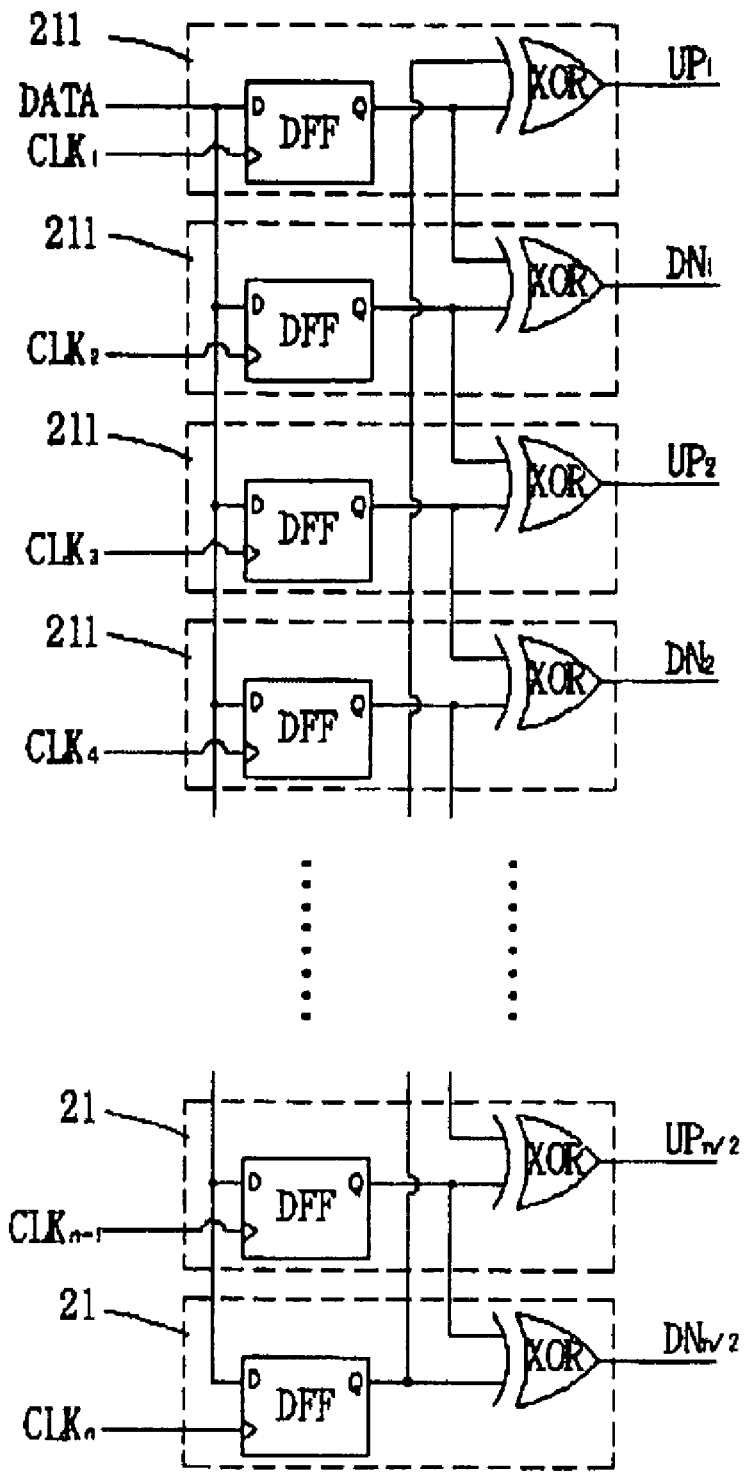
FIG. 6B is a detailed block diagram showing each phase detector of FIG. 6A.

The phase detecting circuit 2 includes a plurality of phase detectors 211 and a logic circuit 22. The phase detectors 211 respectively receive the clock signals $CLK_1$-$CLK_n$ and detect the phase differences between the data signal DATA and the clock signals $CLK_1$-$CLK_n$ to sequentially generate control signals $UP_1$, $DN_1$, ..., $UP_{n/2}$, $DN_{n/2}$. FIG. 6B is a detailed block diagram showing each phase detector 211 of FIG. 6A. Each phase detector 211 includes a D flip-flop DFF and an XOR gate XOR. These D flip-flops DFF receive the data signal DATA and the clock signals $CLK_1$-$CLK_n$, respectively. Each of the clock signals $CLK_1$-$CLK_n$ triggers each D flip-flop DFF to sample the data signal DATA at the rising edge thereof. The D flip-flop DFF samples the data signal DATA and then outputs the sampled result to the XOR gate XOR. The XOR gate XOR of each phase detector 211 is coupled with the D flip-flop in this stage of phase detectors 211 and the D flip-flop in the previous stage of phase detector 211 to receive the outputs of the two D flip-flops and respectively output the control signals $UP_1$, $DN_1$, ..., $UP_{n/2}$ and $DN_{n/2}$. Next, the logic circuit 22 receives the control signals $UP_1$-$UP_{n/2}$, $DN_1$-$DN_{n/2}$, and performs various logic operations according to the control signals $UP_1$-$UP_{n/2}$, $DN_1$-$DN_{n/2}$, to output at least one set of gain control signals $GUP_1$, $GDN_1$.

Figure 7:
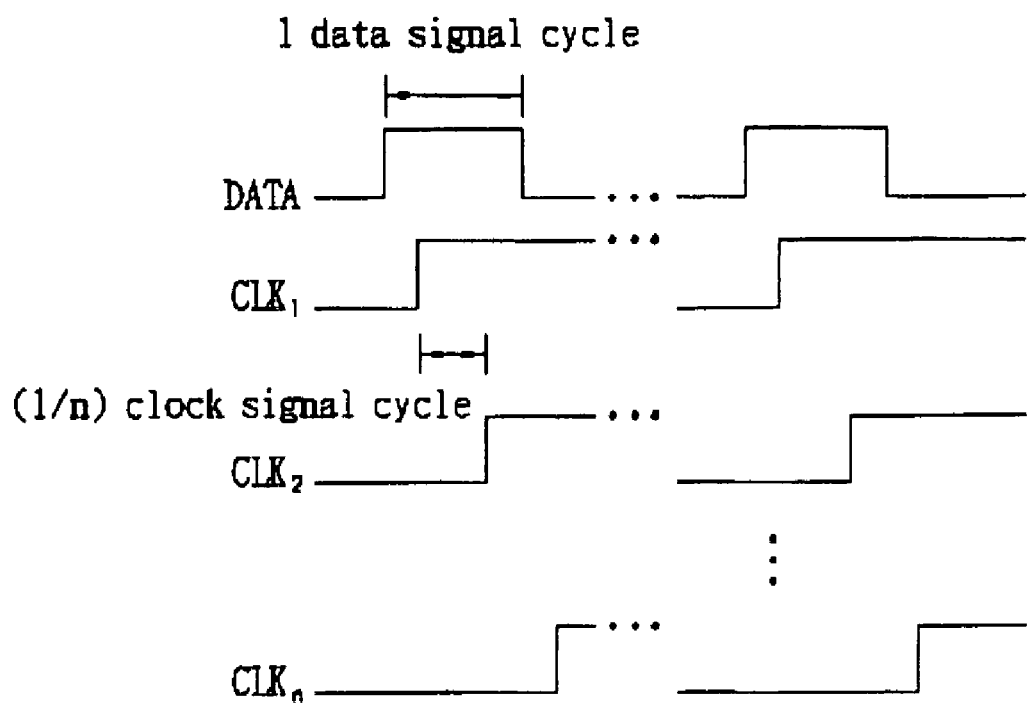
FIG. 7 shows waveforms of each clock signal and a data signal in the phase detecting circuit according to the embodiment of the invention.

FIG. 7 shows waveforms of each of the clock signals $CLK_1$-$CLK_n$ and the data signal DATA in the phase detecting circuit according to the preferred embodiment of the invention. The cycle of the data signal DATA is (2/n) times that of each of the clock signals $CLK_1$-$CLK_n$, and 1/n cycle of the clock signal exists between adjacent ones of the clock signals $CLK_1$-$CLK_n$. Thus, the phase detecting circuit 2 may operate at a lower frequency to detect the high-frequency data signal DATA. The clock signals $CLK_1$-$CLK_n$ are paired to trigger the phase detectors 211 to output the total number of n control signals $UP_1$-$UP_{n/2}$, $DN_1$-$DN_{n/2}$ at each cycle of the data signal DATA. Consequently, the data signal is detected by a plurality of low-frequency clock signals, and the number of high-frequency circuits in the phase detecting circuit 2 may be reduced. Thus, the circuit noise and the circuit cost can be reduced.

The invention gets the different gain curves of phase detecting circuits 2 by properly designing the logic circuit 22. Thus, the clock and data recovery circuit 3 can be optimized in correspondence with different systems to increase the input jitter tolerance of the clock and data recovery circuit 3 with respect to the data signal DATA. The embodiments of several combinations of the logic circuits 22 will be illustrated to explain the phase detecting circuit 2 with the adjustable gain curve of the invention.

Figure 8:
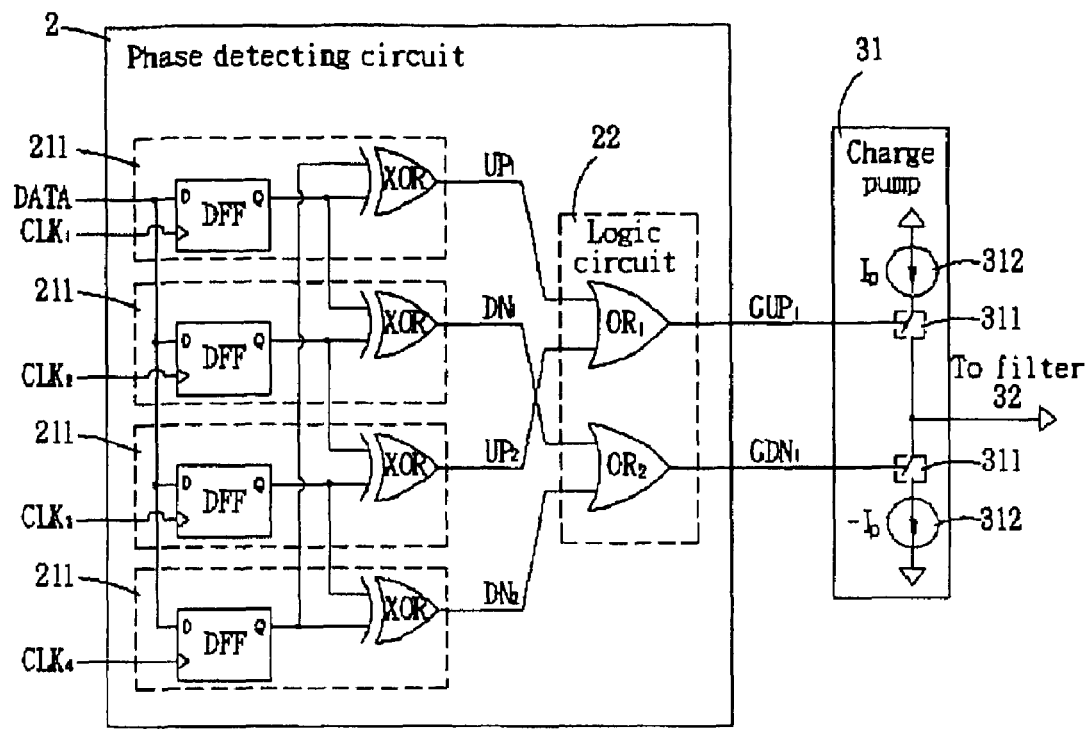
FIG. 8 is a circuit diagram showing the phase detecting circuit according to the embodiment of the invention.

FIG. 8 is a circuit diagram showing the phase detecting circuit according to the embodiment of the invention. Referring to FIG. 8, the voltage control oscillating circuit includes two stages of ring oscillators for generating four clock signals $CLK_1$-$CLK_4$ with different phases. Thus, the clock signals $CLK_1$-$CLK_4$ are lowered to one half of the frequency of the data signal DATA for operation. The phase detecting circuit 2 includes four phase detectors 211 for respectively receiving the clock signals $CLK_1$-$CLK_4$ and detecting the phase differences between the data signal DATA and the clock signals $CLK_1$-$CLK_4$ by comparison to generate the signals $UP_1$, $DN_1$, $UP_2$, $DN_2$.

In this embodiment, the logic circuit 22 includes two OR gates $OR_1$, $OR_2$. The OR gate $OR_1$ processes the control signals $UP_1$, $UP_2$ by the OR operation to judge whether one of the control signals $UP_1$-$UP_2$ is enabled to enable the gain control signal $GUP_1$. The OR gate $OR_2$ processes the control signals $DN_1$, $DN_2$ by the OR operation to judge whether one of the control signals $DN_1$-$DN_2$ is enabled to enable the gain control signal $GDN_1$. In view of the value of the current $I_p$ outputted by the charge pump 31 under the control of the set of gain control signals $GUP_1$, $GDN_1$ when the control signals $UP_1$, $UP_2$, $DN_1$, $DN_2$ serve as the inputs, the gain curve of the phase detecting circuit 2 is shown in FIG. 9.

Figure 10:
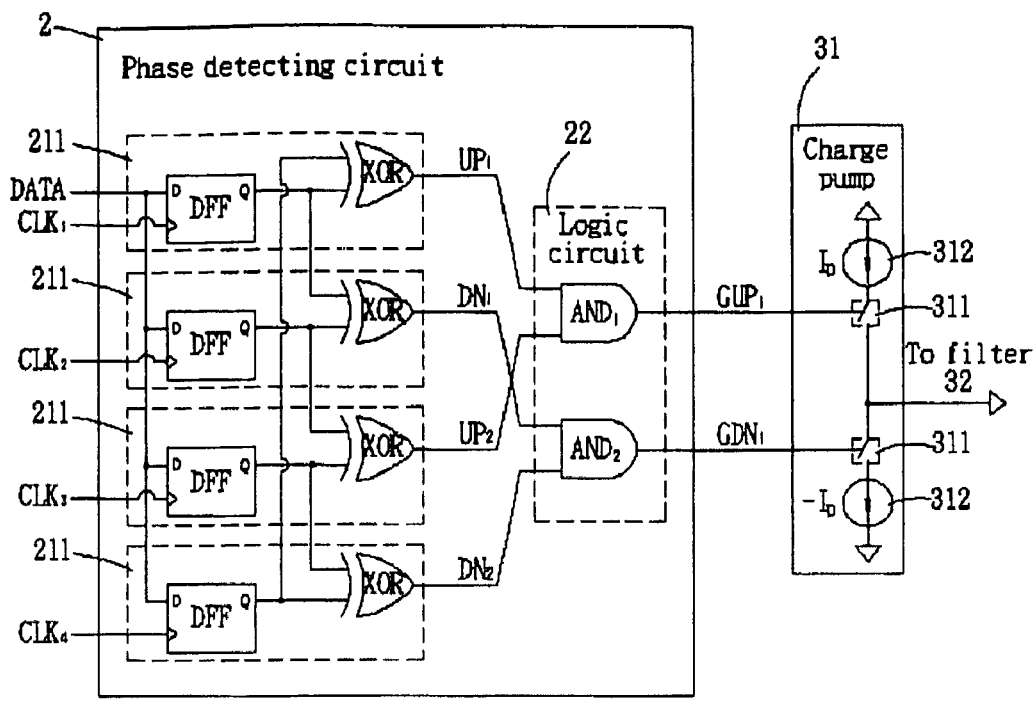
FIG. 10 is another circuit diagram showing the phase detecting circuit according to the embodiment of the invention.

In addition, as shown in FIG. 10, the logic circuit 22 in this embodiment includes two AND gates $AND_1$, $AND_2$. The AND gate $AND_1$ processes the control signals $UP_1$, $UP_2$ by the AND operation to judge whether both of the control signals $UP_1$-$UP_2$ are enabled to enable the gain control signal $GUP_1$. The AND gate $AND_2$ processes the control signals $DN_1$, $DN_2$ by the AND operation to judge whether both of the control signals $DN_1$-$DN_2$ are enabled to enable the gain control signal $GDN_1$. The gain curve generated by the set of gain control signals $GUP_1$, $GDN_1$ is shown in FIG. 11.

Figure 9:
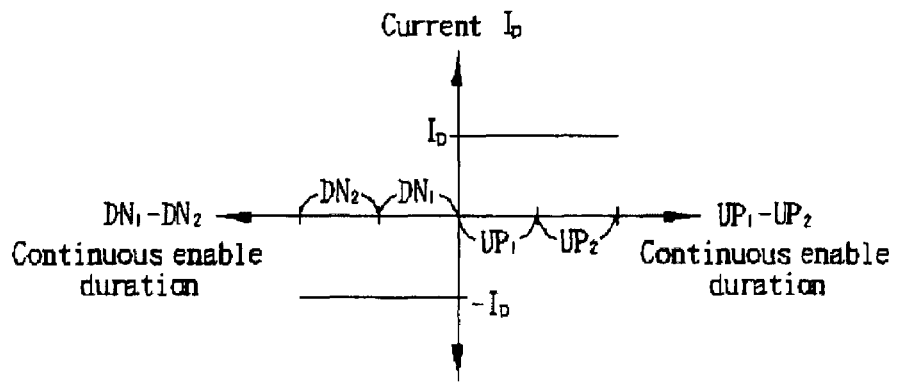
FIG. 9 shows a gain curve of the phase detecting circuit of FIG. 8.
Figure 11:
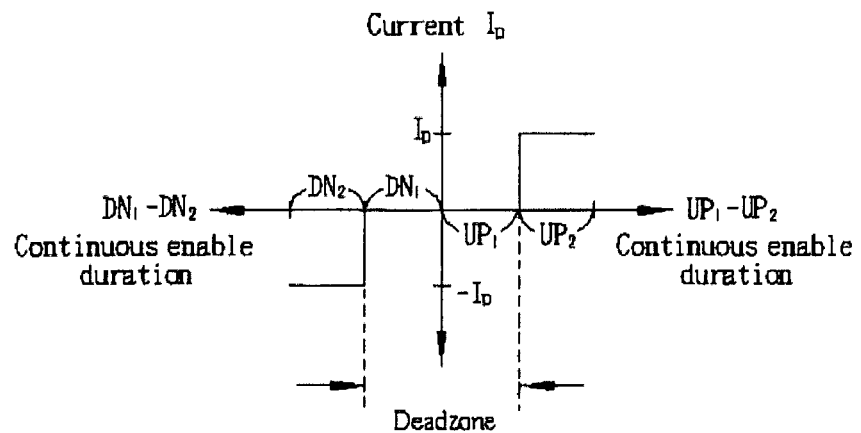
FIG. 11 shows a gain curve of the phase detecting circuit of FIG. 10.

As shown in FIGS. 9 and 11, the different gain curves corresponding to phase detecting circuits 2 may be generated after the logic circuit 22 is properly designed In FIG. 11, because the control signals are processed by the AND operation, a dead zone in the gain curve may be generated as compared with FIG. 9. Thus, the input jitter tolerance of the phase detecting circuit 2 with respect to the input signal may be enhanced.

If the different gain curves corresponding to phase detecting circuits 2 have to be further generated, more clock signals with lower frequency may be generated in the clock and data recovery circuit 3 such that each phase detector 211 can detect more cycles of data signal DATA and output more control signals in one cycle of the clock signal. The logic circuit 22 may perform more logic operations according to more control signals so as to generate the diversified gain curves for the phase detecting circuit 2.

In order to make the readers more easily understand the frequency reduction operation and the various logic operations, illustrations will be made in the following embodiment by taking the reduction of the frequency of the clock signals $CLK_1$-$CLK_8$ to one fourth that of the data signal DATA as an example.

Figure 12:
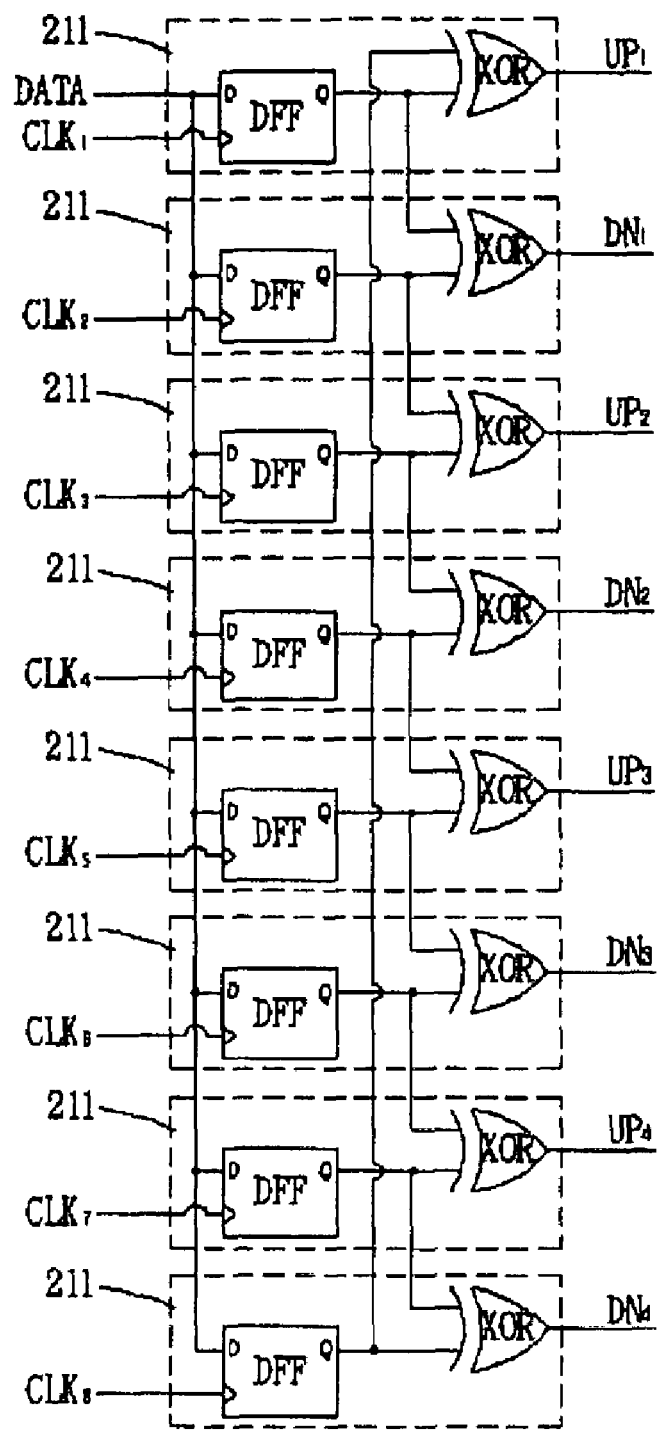
FIG. 12 is a circuit diagram showing each phase detector 211 in the phase detecting circuit according to the embodiment of the invention.

As shown in FIG. 12, the voltage control oscillating circuit in this embodiment includes four stages of ring oscillators for generating eight clock signals $CLK_1$-$CLK_8$ with different phases. Thus, the frequency of the clock signals $CLK_1$-$CLK_8$ is lowered to one fourth that of the data signal DATA for operation. The phase detecting circuit 2 includes eight phase detectors 211 for receiving the clock signals $CLK_1$-$CLK_8$ and detecting the phase differences between the data signal DATA and the clock signals $CLK_1$-$CLK_8$ by comparison to sequentially generate the signals $UP_1$, $DN_2$, to $UP_4$, $DN_4$.

Figure 13:
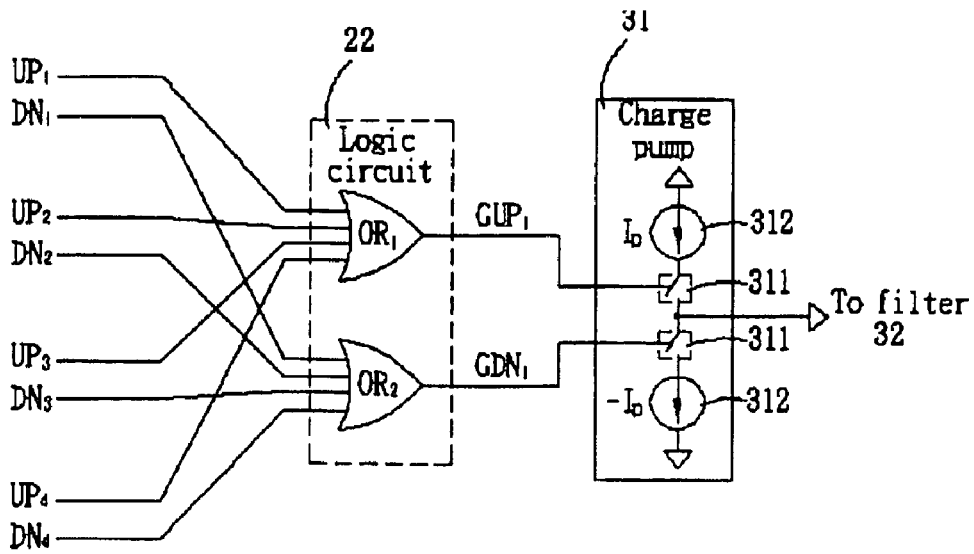
FIG. 13 is still another circuit diagram showing the phase detecting circuit according to the embodiment of the invention.
Figure 14:
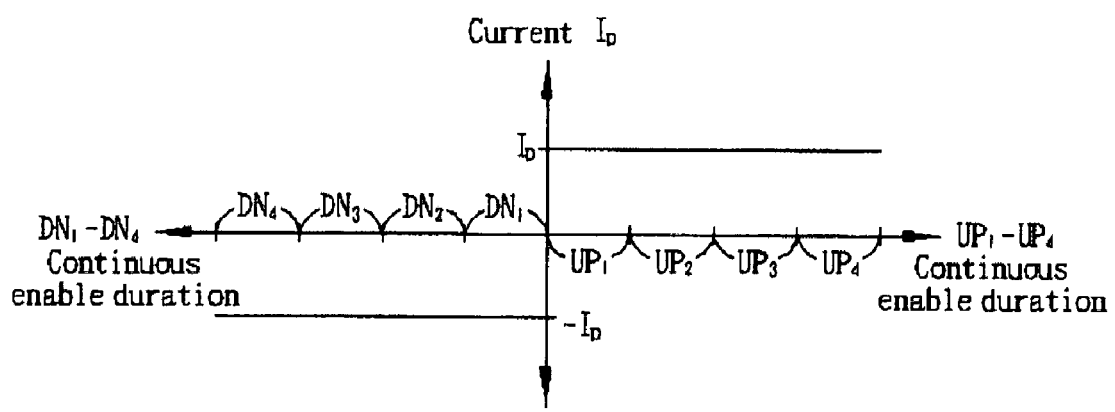
FIG. 14 shows a gain curve of the phase detecting circuit of FIGS. 12 and 13.

Referring to FIG. 13, the logic circuit 22 includes two OR gates $OR_1$, $OR_2$. The OR gate $OR_1$ processes the control signals $UP_1$-$UP_4$ by the OR operation to judge whether one of the control signals $UP_1$-$UP_4$ is enabled to enable the gain control signal $GUP_1$. The OR gate $OR_2$ processes the control signals $DN_1$-$DN_4$ by the OR operation to judge whether one of the control signals $DN_1$-$DN_4$ is enabled to enable the gain control signal $GDN_1$. The gain curve generated by this set of gain control signals $GUP_1$, $GDN_1$ is shown in FIG. 14.

In the above-mentioned embodiment, the phase detecting circuit 2 only outputs one set of gain control signals $GUP_1$, $GDN_1$ to control one set of current sources in the charge pump 31. In order to diversify the gain curve of the phase detecting circuit 2, an example, in which the phase detecting circuit 2 outputs a plurality of sets of gain control signals to control a plurality of sets of current sources of the charge pump 31, will be illustrated in the following embodiment.

Figure 15:
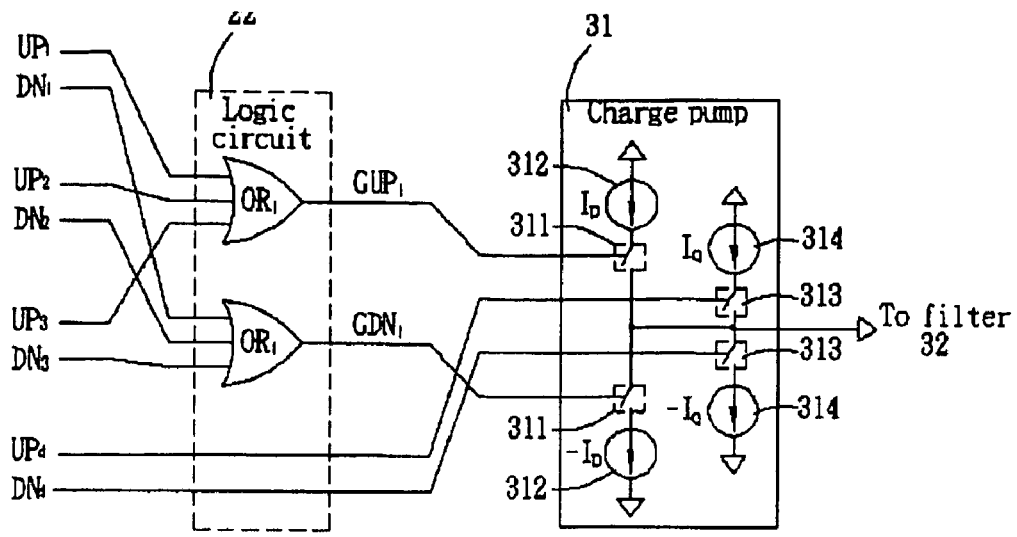
FIG. 15 is yet still another circuit diagram showing the phase detecting circuit according to the embodiment of the invention.
Figure 16:
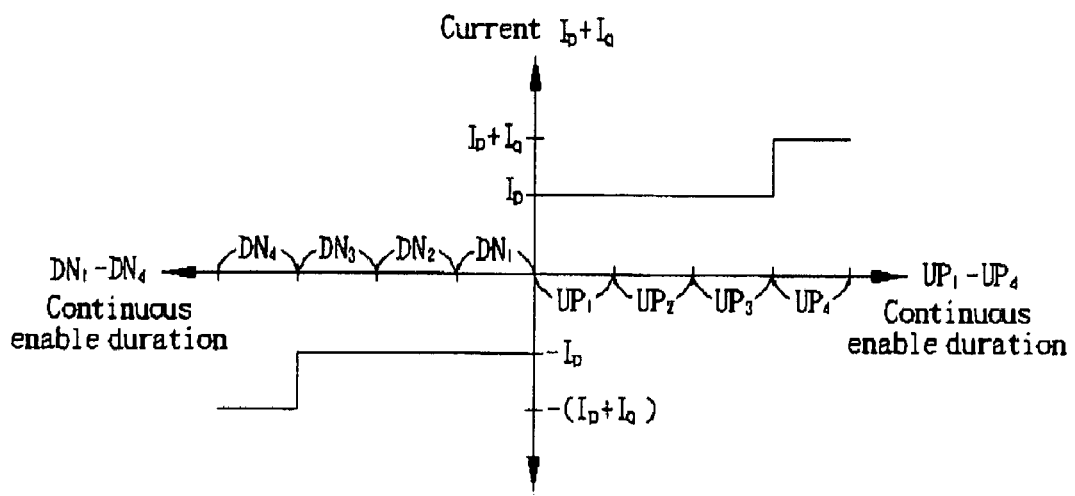
FIG. 16 shows a gain curve of the phase detecting circuit of FIGS. 12 and 15.

Referring to FIG. 15, the logic circuit 22 includes two OR gates $OR_1$, $OR_2$, and the charge pump 31 includes two sets of current sources 312, 314 for outputting the currents $I_p$, $I_q$. The OR gate $OR_1$ processes the control signals $UP_1$-$UP_3$ by the OR operation to judge whether one of the control signals $UP_1$-$UP_3$ is enabled to enable the gain control signal $GUP_1$. The OR gate $OR_2$ processes the control signals $DN_1$-$DN_3$ by the OR operation to judge whether one of the control signals $UP_1$-$UP_3$ is enabled to enable the gain control signal $GDN_1$. This set of gain control signals $GUP_1$, $GDN_1$ may control the switches 311 to turn on the first set of current sources 312 to output/input the current $I_p$. The control signals $UP_4$, $DN_4$ may serve as another set of gain control signals to control switches 313 to turn on the second set of current sources 314 to output/input the current $I_q$. Thus, the total current outputted by the charge pump 31 is the combination of the currents $I_p$, $I_q$ and can be dynamically adjusted such that another type of gain curve may be generated. The gain curve generated by the two sets of gain control signals is shown in FIG. 16.

Figure 17:
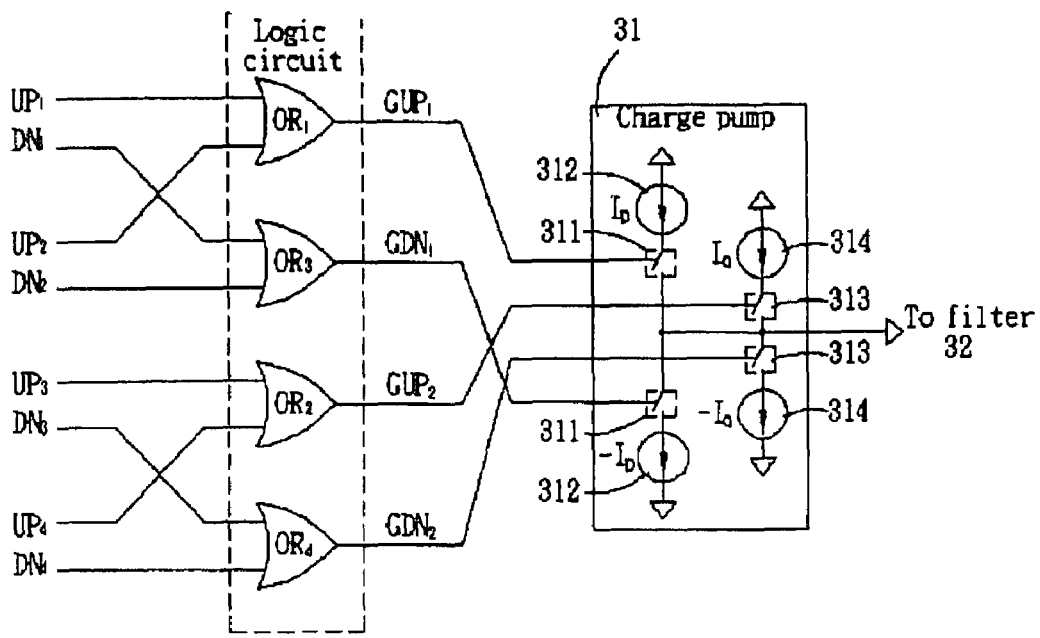
FIG. 17 is yet still another circuit diagram showing the phase detecting circuit according to the embodiment of the invention.
Figure 18:
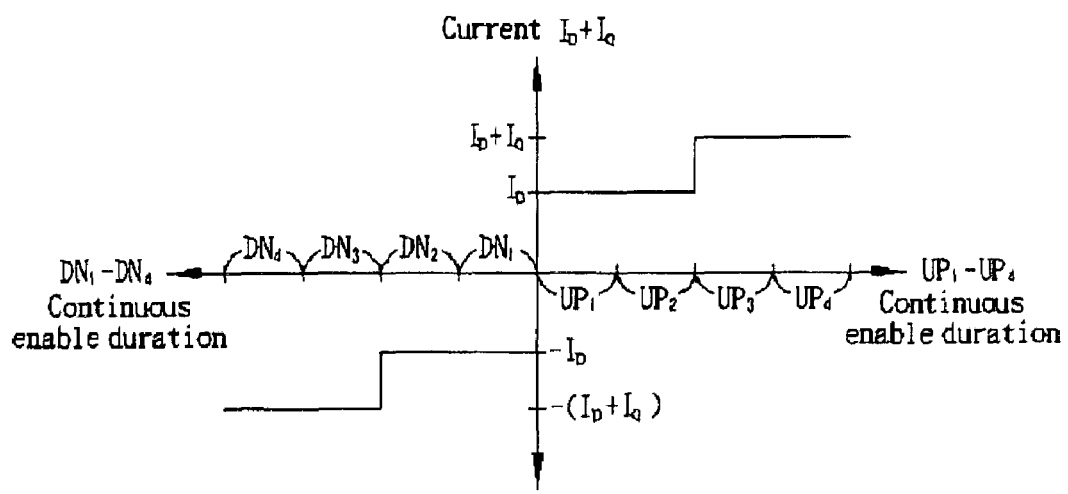
FIG. 18 shows a gain curve of the phase detecting circuit of FIGS. 12 and 17.

In addition, as shown in FIG. 17, the logic circuit 22 includes four OR gates $OR_1$-$OR_4$. The OR gate $OR_1$ processes the control signals $UP_1$, $UP_2$ by the OR operation to judge whether one of the control signals $UP_1$-$UP_2$ is enabled to enable the gain control signal $GUP_1$. The OR gate $OR_2$ processes the control signals $UP_3$, $UP_4$ by the OR operation to judge whether one of the control signals $UP_3$-$UP_4$ is enabled to enable the gain control signal $GUP_2$. Similarly, the OR gates $OR_3$, $OR_4$ receive the control signals $DN_1$-$DN_4$ to output the gain control signals $GDN_1$, $GDN_2$, respectively. This set of gain control signals $GUP_1$, $GDN_1$ can control the first set of current sources 312 to work, and the other set of gain control signals $GUP_2$, $GDN_2$ can control the second set of current sources 314 to work. The gain curve generated by the two sets of gain control signals is shown in FIG. 18.

As shown in the embodiments in FIGS. 12 to 18, after the phase detecting circuit 2 is lowered to the lower frequency and receives more clock signals to operate, the logic gates in the logic circuit 22 or the charge pump 31 may be further diversified and generate different gain curves for the phase detecting circuit 2. In addition, the currents $I_p$, $I_q$ may be adjusted to have different values in the embodiment of FIGS. 15 to 18 such that the phase detecting circuit 2 generates different gains and the clock and data recovery circuit 3 can be optimized in correspondence with different systems. Furthermore, the OR gates of the logic circuit 22 in the embodiment of FIGS. 12 to 18 may be replaced with the AND gates or any other combinational logic such that the gain curves of the phase detecting circuit 2 may be further diversified.

Figure 19:
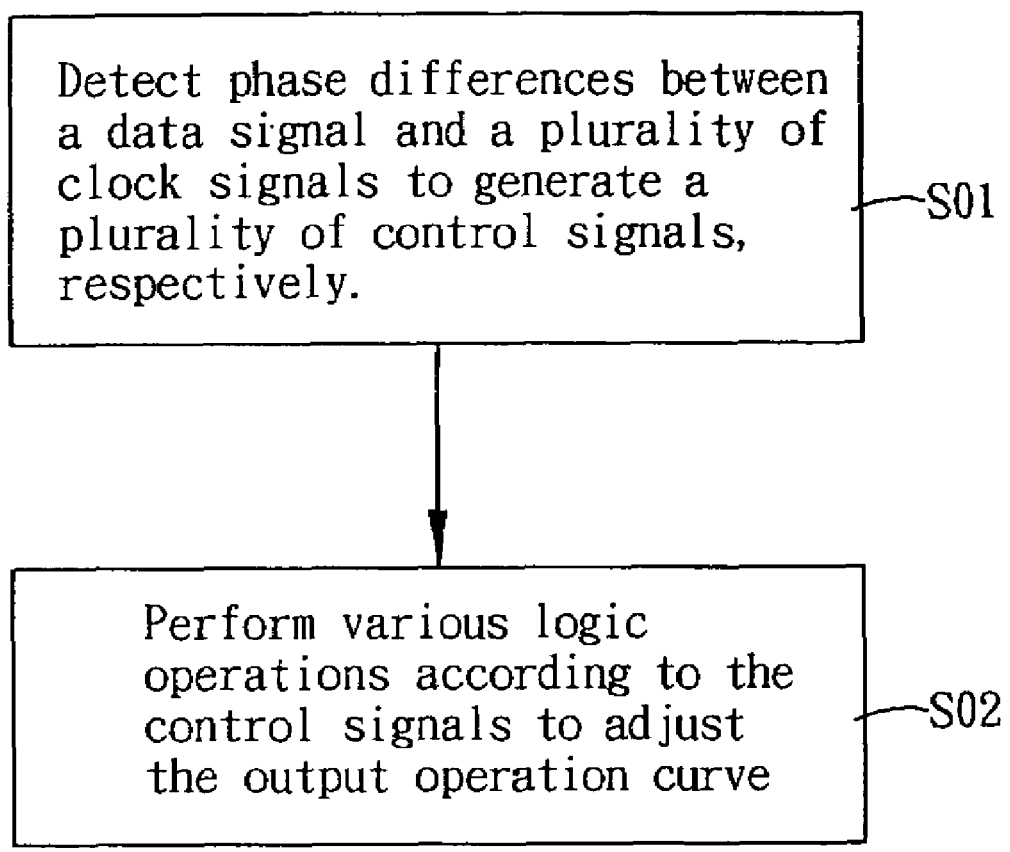
FIG. 19 is a flow chart showing a phase detecting method according to the embodiment of the invention.

FIG. 19 is a flow chart showing a phase detecting method according to the embodiment of the invention. Referring to FIG. 19, the method includes the following steps S01 and S02.

Step S01: detecting phase differences between a data signal and a plurality of clock signals by comparison to generate a plurality of control signals, respectively. The clock signals have the same frequency but difference phases, and the frequency of the data signal is a multiple of the frequency of the clock signals.

Step S02: performing various logic operations according to the control signals to adjust a gain curve.

Step S02 may further include outputting at least one set of gain control signals to control a charge pump to generate at least one current to constitute different gain curves.

In summary, the data signal is detected using a plurality of low-frequency clock signals in the phase detecting circuit and the phase detecting method of the invention, so the number of high-frequency circuits in the phase detecting circuit may be decreased. Thus, the noise in the circuit as well as the circuit cost can be reduced. In addition, the control signals are operated using the logic gate, so the gain curve of the phase detecting circuit can be adaptively adjusted to increase the tolerance with respect to the input signal jitter, and less delay is generated by the logic gates in the logic circuit such that the generation of the extra signal jitter can be avoided. Furthermore, if the phase detecting circuit has to be applied to different systems, different gain curves can be generated to adapt to the systems by properly designing the logic gate in the logic circuit.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A phase detecting circuit having an adjustable output operation curve, comprising:
   a plurality of phase detectors for detecting phase differences between a data signal and a plurality of clock signals by comparison, respectively, to output a plurality of control signals, wherein the clock signals have the same frequency but difference phases, and a frequency of the data signal is a multiple of the frequency of the clock signals; and
   a logic circuit comprising at least two AND gates for performing various logic operations according to the control signals to output at least one set of gain control signals for adjusting an output operation curve to generate a dead zone of the phase detecting circuit,
   wherein the output operation curve includes at least two step functions, and at least two sets of gain control signals control at least two sets of current sources in a charge pump to generate at least two currents.

2. The phase detecting circuit according to claim 1, wherein when the number of the clock signals is n, the frequency of the data signal is equal to n/2 times that of the clock signals, and the phase detecting circuit comprises n phase detectors for receiving the n clock signals to output the n control signals.

3. The phase detecting circuit according to claim 1, wherein each of the phase detectors comprises:
   a D flip-flop for receiving the data signal and one of the clock signals to sample the data signal according to an edge of the clock signal; and
   an XOR gate, which is coupled with the D flip-flop and a D flip-flop of a previous stage of phase detector, for receiving outputs of the two D flip-flops and outputting one of the control signals.

4. The phase detecting circuit according to claim 1, wherein the logic circuit comprises:
   a plurality of logic gates for performing the logic operations according to the control signals to output a plurality of sets of the gain control signals for respectively controlling a plurality of sets of current sources of a charge pump to adjust different output operation curves.

5. A method of adjusting an output operation curve, the method comprising the steps of:
   detecting phase differences between a data signal and a plurality of clock signals by comparison to generate a plurality of control signals, respectively, wherein the clock signals have the same frequency but difference phases, and a frequency of the data signal is a multiple of the frequency of the clock signals; and
   performing various logic operations according to the control signals to adjust the output operation curve,
   wherein the step of performing the logic operations is to perform AND operations, and the output operation curve includes at least two step functions, and outputting at least two sets gain control signals controlling at least two sets of current sources in a charge pump to generate at least two currents for adjusting different output operation curve to generate a dead zone.

6. The method according to claim 5, wherein when the number of the clock signals is n, the frequency of the data signal is equal to n/2 times that of the clock signals, and the detecting step outputs the n control signals.

7. The method according to claim 5, wherein the step of performing the logic operations comprises:
   outputting a plurality of sets of gain control signals for respectively controlling a plurality of sets of current sources of a charge pump to adjust different output operation curves.

* * * * *